United States Patent
Smith et al.

(10) Patent No.: US 6,185,707 B1
(45) Date of Patent: Feb. 6, 2001

(54) IC TEST SOFTWARE SYSTEM FOR MAPPING LOGICAL FUNCTIONAL TEST DATA OF LOGIC INTEGRATED CIRCUITS TO PHYSICAL REPRESENTATION

(75) Inventors: Shawn Smith, Austin; Hari Balachandran, Dallas; Jason Parker, Coppell, all of TX (US)

(73) Assignee: Knights Technology, Inc., Sunnyvale, CA (US)

(*) Notice: Under 35 U.S.C. 154(b), the term of this patent shall be extended for 0 days.

(21) Appl. No.: 09/192,164

(22) Filed: Nov. 13, 1998

(51) Int. Cl.$^7$ ................................ G01R 31/28
(52) U.S. Cl. ................ 714/724; 382/145; 438/10; 714/733
(58) Field of Search .................... 714/733, 737, 714/26, 723, 724; 382/145, 149, 151, 168; 250/559.4, 559.45; 356/237.4; 702/35, 84; 700/79, 182; 324/614, 752, 500, 73.1, 754; 438/10, 17, 975

(56) References Cited

U.S. PATENT DOCUMENTS

| | | | |
|---|---|---|---|
| 3,906,163 | * 9/1975 | Brenski et al. | 379/284 |
| 4,222,514 | * 9/1980 | Bass | 714/739 |
| 4,242,751 | * 12/1980 | Henckels et al. | 714/737 |
| 4,477,775 | * 10/1984 | Fazekas | 324/751 |
| 4,733,176 | * 3/1988 | Feuerbaum | 324/752 |
| 4,801,869 | * 1/1989 | Sprogis | 714/733 |
| 4,967,337 | * 10/1990 | English et al. | 364/184 |
| 5,219,765 | * 6/1993 | Yoshida et al. | 438/10 |
| 5,469,443 | * 11/1995 | Saxena | 714/720 |
| 5,475,694 | * 12/1995 | Ivanov et al. | 714/732 |
| 5,528,553 | * 6/1996 | Saxena | 365/230.01 |
| 5,596,587 | * 1/1997 | Douglas et al. | 714/739 |
| 5,720,031 | * 2/1998 | Lindsay | 714/42 |
| 5,963,881 | * 10/1999 | Kahn et al. | 702/35 |
| 6,091,846 | * 7/2000 | Lin et al. | 382/145 |

OTHER PUBLICATIONS

Burdick, W.; Duam, W., "High yield multichip modules based on minimal IC pretest", Test Conference, 1994. Proceedings, International, pp. 30–40.*

(List continued on next page.)

Primary Examiner—Albert De Cady
Assistant Examiner—Guy Lamarre
(74) Attorney, Agent, or Firm—Burns Doane Swecker & Mathis L.L.P.

(57) ABSTRACT

The present invention, generally speaking, takes advantage of the foregoing capability to determine and display the X,Y location corresponding to a net name, by translating functional test data of a digital logic chip passed through a simulation model which identifies one or more defective nets of the chip. The defective nets are processed against a database of the foregoing type to obtain X,Y coordinate data for these nets, allowing them to be data logged as physical traces on the chip layout. In accordance with an exemplary embodiment, this mapping is performed by taking the output from a functional tester and translating it from a list of failed scan chains into a list of suspected netlist nodes. The X,Y coordinates of suspected netlist nodes are then identified and stored in a database, providing failure analysis and yield enhancement engineers a starting point for performing failure analysis and for immediately understanding whether "in-line" inspection data can account for a given failure. These nodes may then be crossmapped from the circuit design onto the chip's layout for each of multiple photomask layers within the design. Detailed failure data is gathered and stored at the wafer stage as part of a comprehensive program rather than on an as-needed basis at the packaged part stage. A voluminous amount of high-quality data is therefore obtained in an entirely automated fashion, as opposed to obtaining a comparatively minuscule amount of lesser-quality data in an exceedingly laborious fashion.

9 Claims, 9 Drawing Sheets

OTHER PUBLICATIONS

Yue, J.; Liu, S.T.; Fechner, P.; Gardner, G.; Witcraft, W.; Finn, C., "An effective method to screen SOI wafers for mass production", SOI Conference, 1994 Proceedings., 1994 IEEE International, pp. 113–114.*

Mullenix, P.; Zalnoski, J.; Kasten, A.J.; "Limited yield estimation for visual defect sources", Semiconductor Manufacturing, IEEE Transactions on Volume, pp. 17–23, Oct. 1997.*

Chen–Pin Kung; Chun–Jieh Huang; Chen–Shang Lin, "Fast fault simulation for BIST applications", Test Symposium, 1995., Proceddings of the Fourth Asian, pp. 93–99.*

Wieler, R.W.; Zhang, Z.; McLeod, R.D., "Using an FPGA based computer as a hardware emulator for built–in self–test structures", Rapid System Prototyping, 1994. Shortening the Path from Specification to Prototype. Proceedings., Fifth International Workshop.*

McLeod, G.R., "Built–in system test and fault location", Proceedings of the 1994 IEEE International test Conference, pp. 291–299.*

Hussain, A.; Hayes, J.P., "Design Verification via simulation an automatic test pattern generation", IEEE, pp. 174–180, 1995.*

Flint, A., "A comparison of test requirements, methods, and results for seven MCM products", test Conference, 1995. Proceedings, International, pp. 202–207.*

* cited by examiner

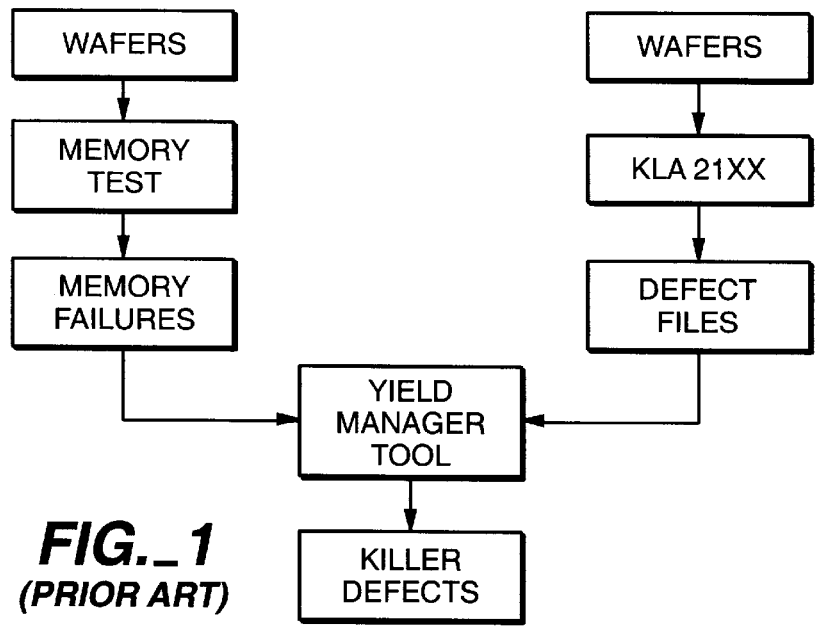
FIG._1
(PRIOR ART)
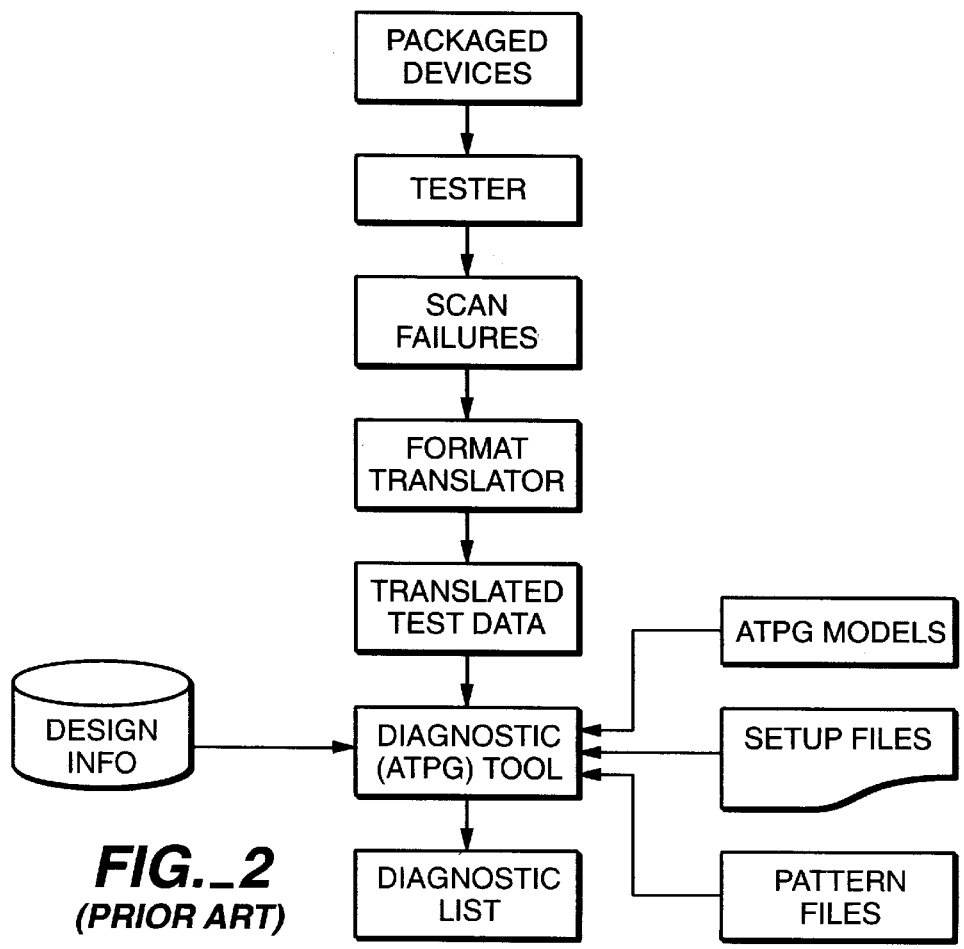
FIG._2
(PRIOR ART)

```
DeviceID = DEMOID
LotID = TESTLOT01
WaferID = 01
DIE = -4,0
datalog.scan.10 diagnosis summary, #failing_patterns=9   #defects=2
#unexplained_fails=2
unexplained patterns = 212 250
------------------------------------------------------------
fault candidates for defect 1,   #failing_patterns_explained=5
Warning: Fault candidates will cause passing patterns to fail.
failing patterns explained = 322 706 738 770
type   code    pin_pathname
----   ----    ------------
 1     DS      /XTIO_0/XTTLI8_1612/N2_23
 1     DS      /PI9
------------------------------------------------------------
diagnosis CPU time = .68 sec
```

FIG._3
*(PRIOR ART)*

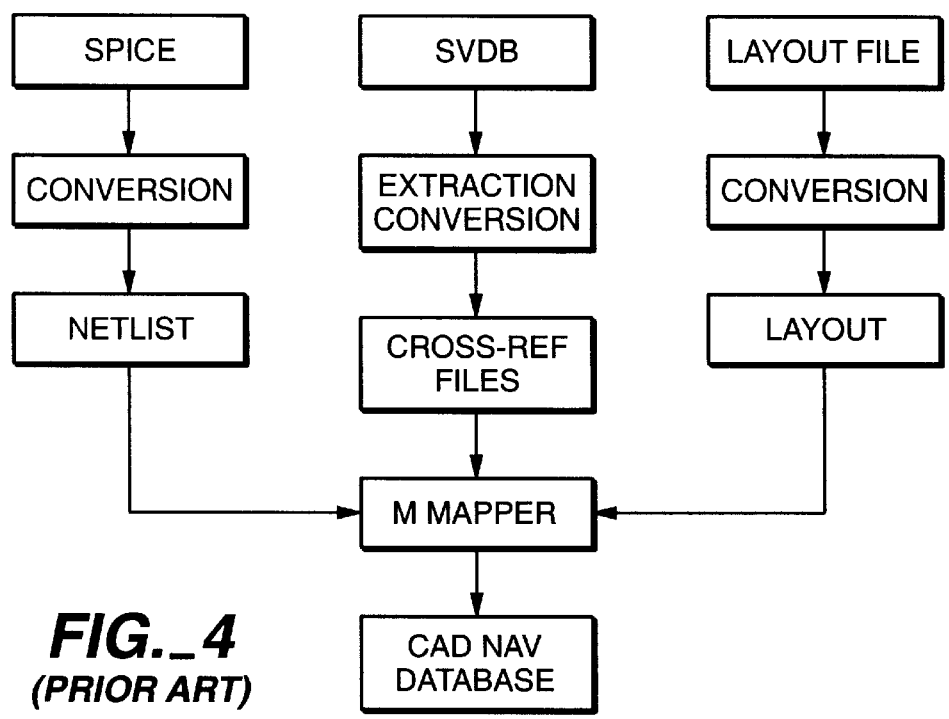
FIG._4
*(PRIOR ART)*
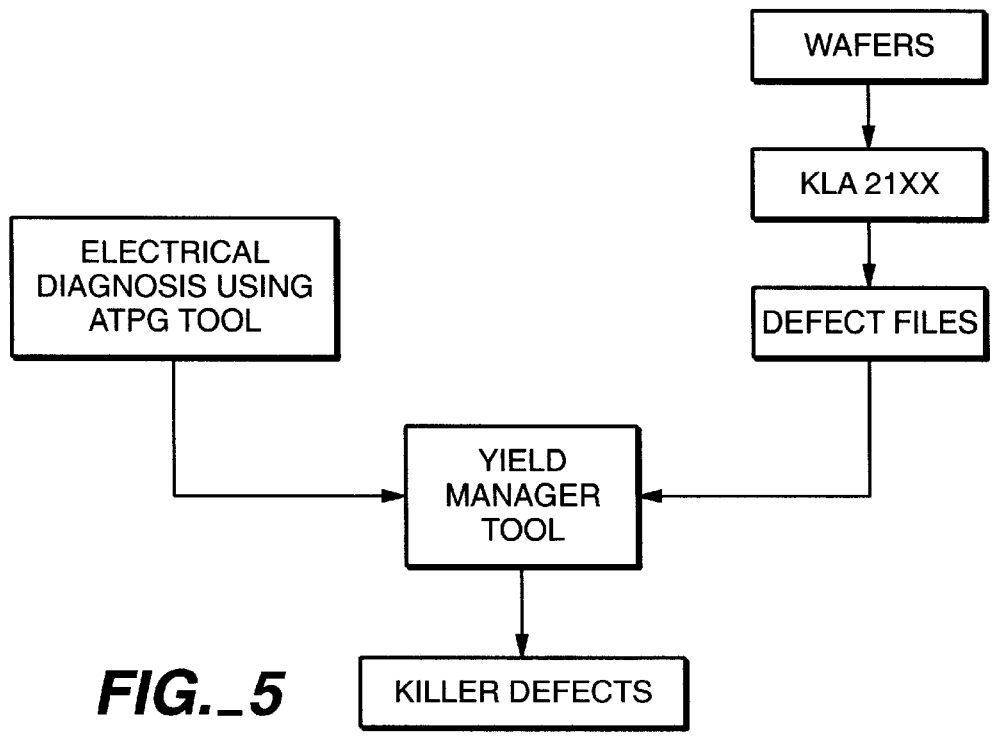
FIG._5

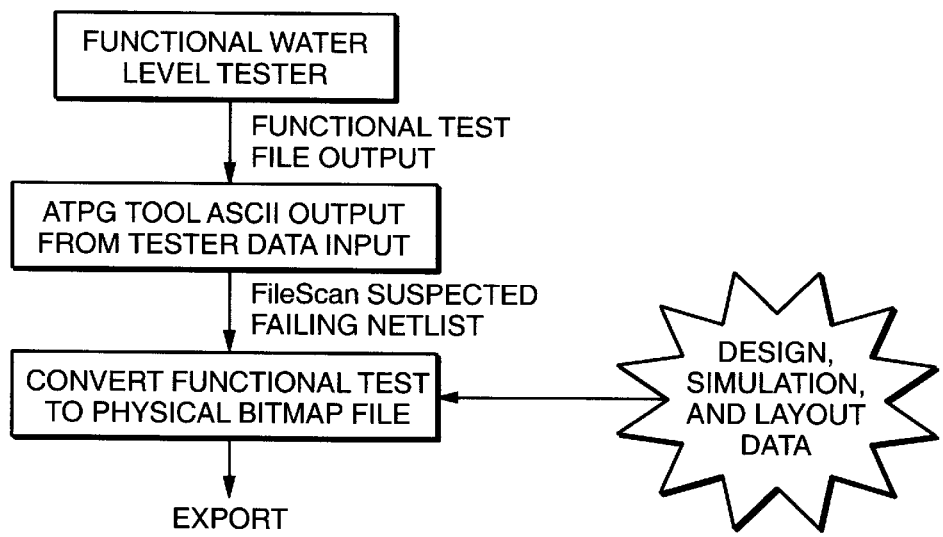
FIG._6
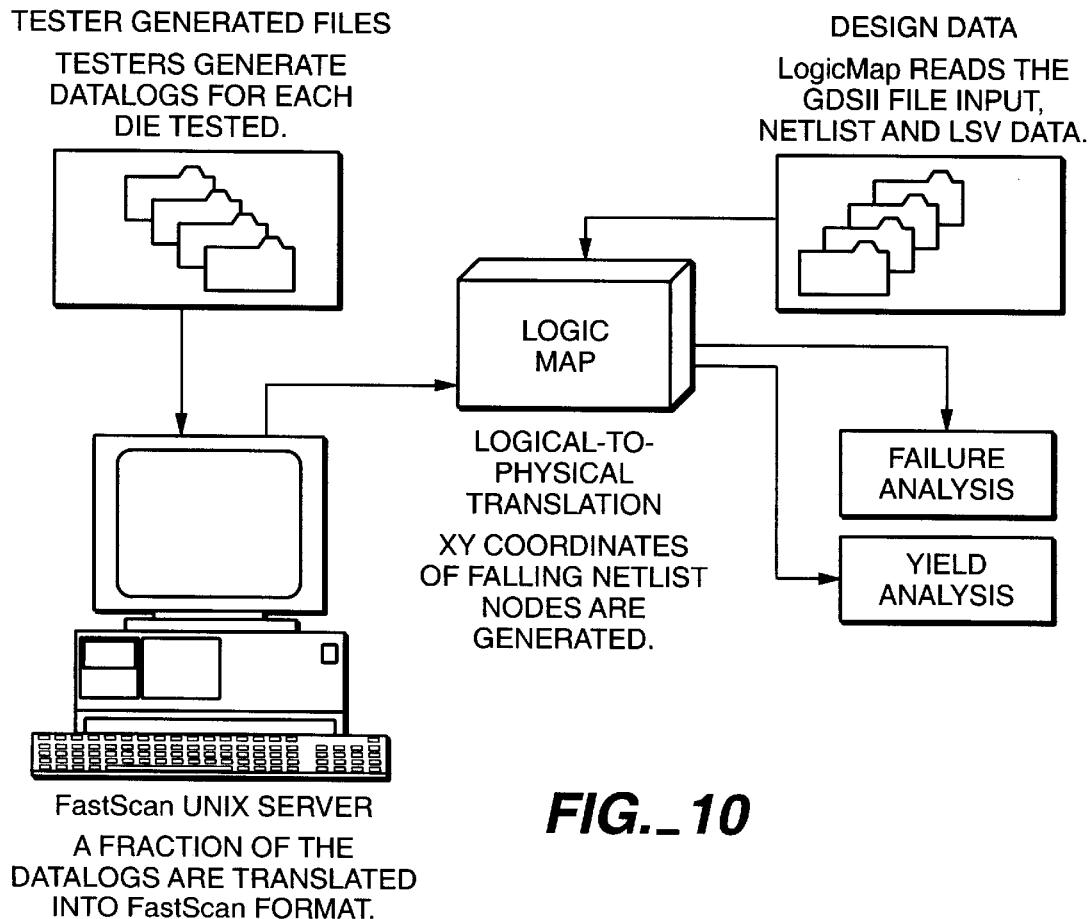
FIG._10

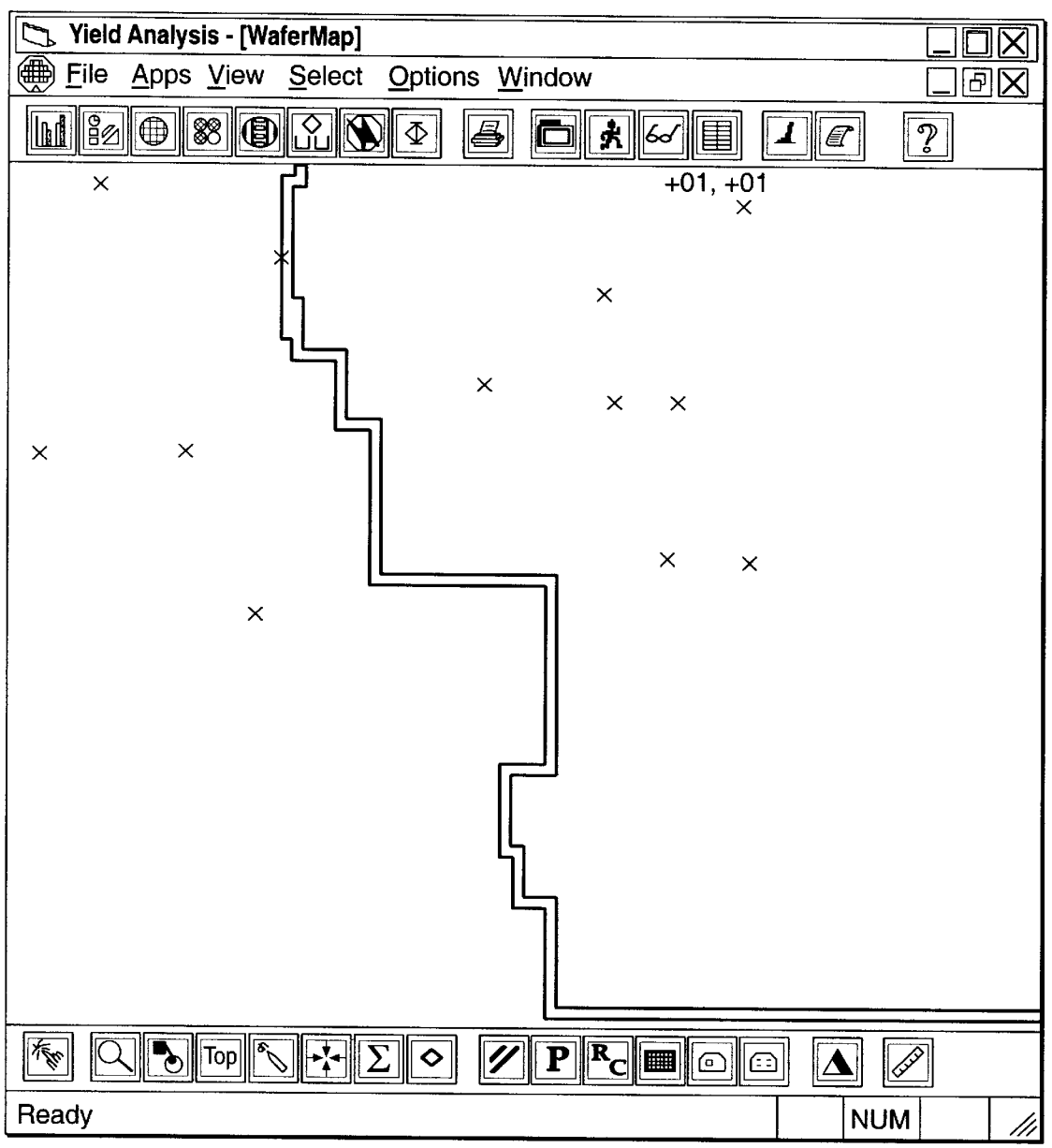
FIG._7

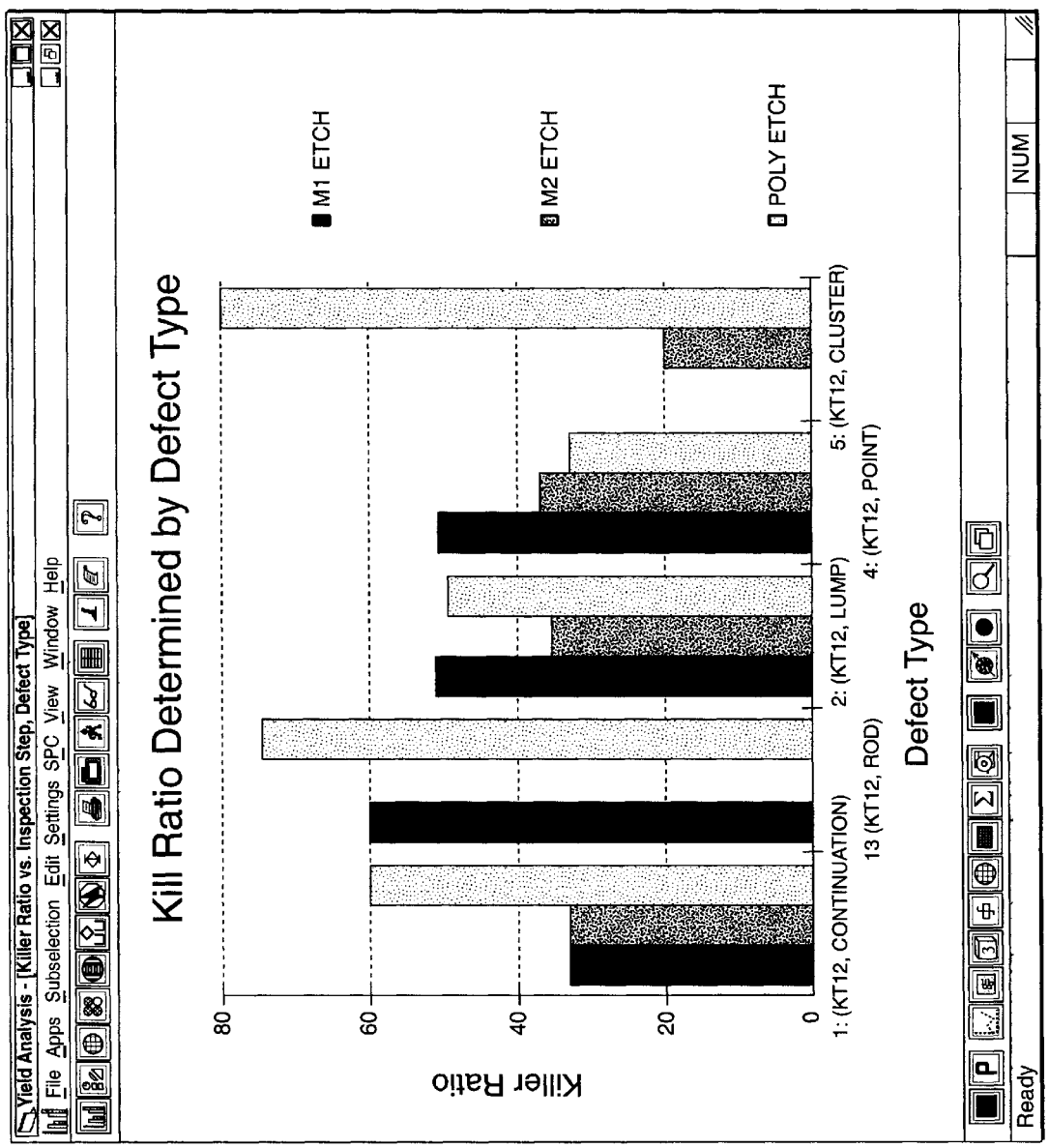
FIG._8

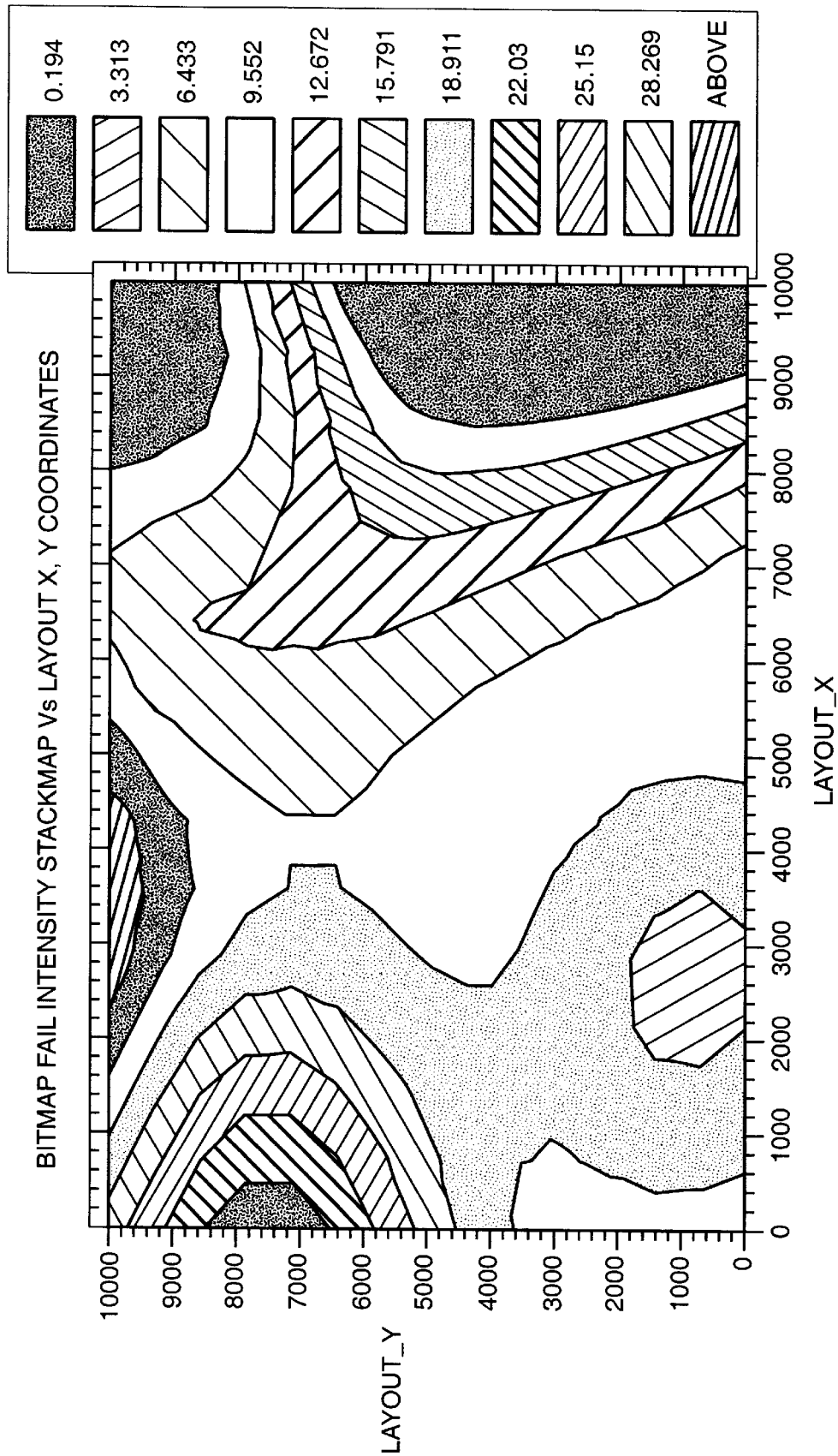
FIG._9

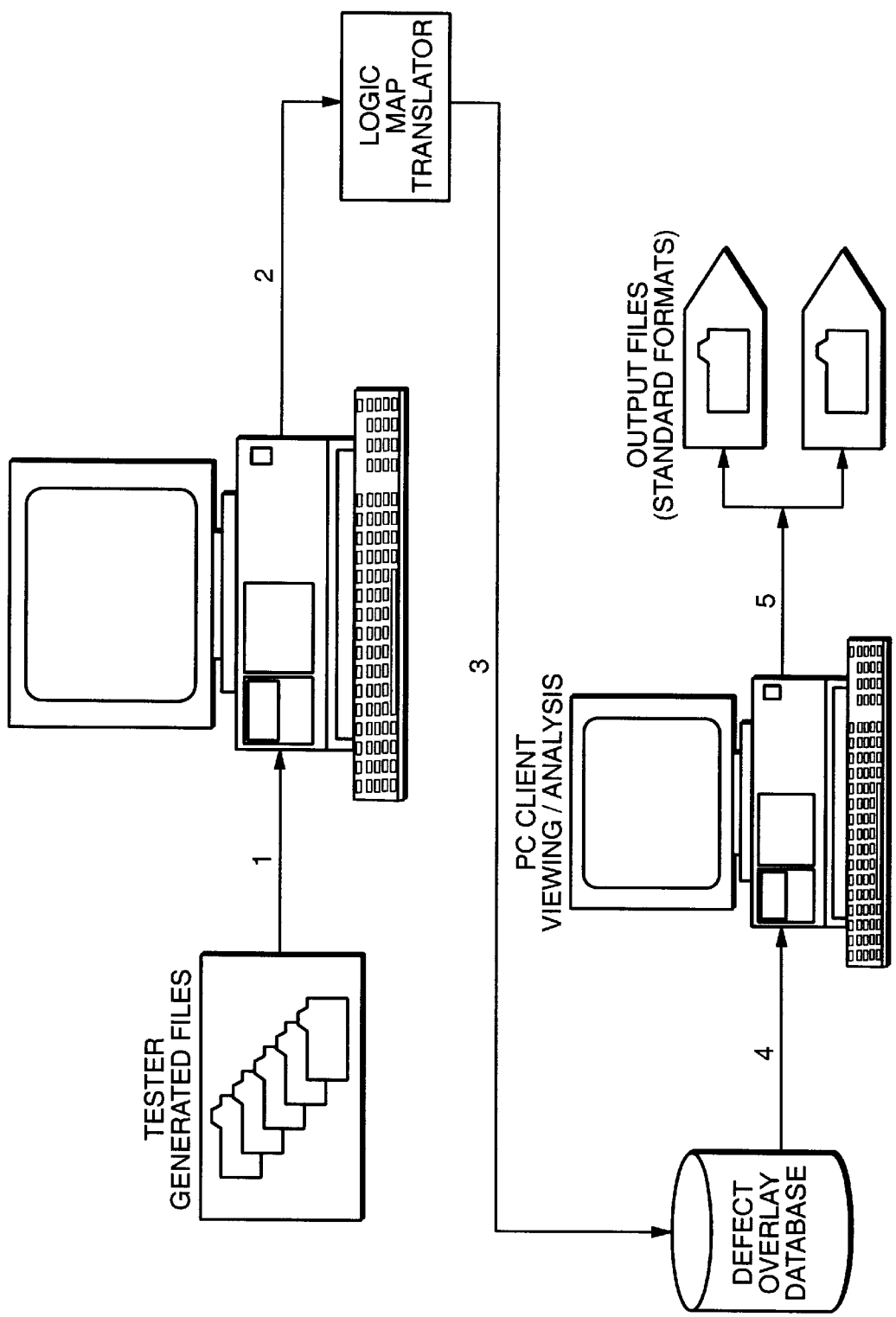
FIG._11

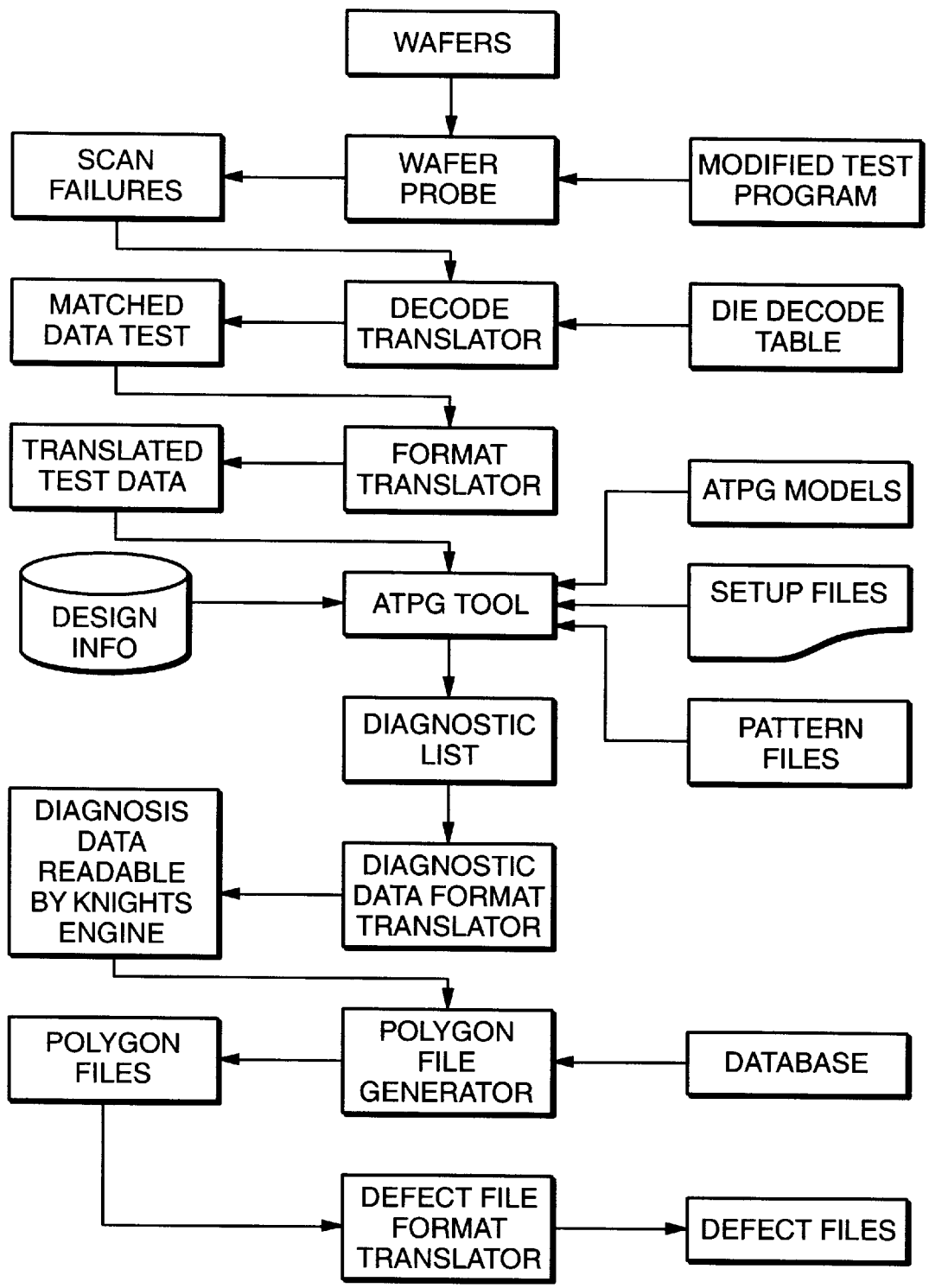
FIG._12

IC TEST SOFTWARE SYSTEM FOR MAPPING LOGICAL FUNCTIONAL TEST DATA OF LOGIC INTEGRATED CIRCUITS TO PHYSICAL REPRESENTATION

BACKGROUND OF THE INVENTION

1. Field of the Invention

The present invention relates to integrated circuit (IC) chip test software systems.

2. State of the Art

Digital semiconductor chips may be divided into two main categories, memory chips and logic chips. A microprocessor is one example of a logic chip. Digital semiconductor chips are designed by skilled chip designers using sophisticated software tools. Because of the difficulty of testing such chips, a field known as Design For Test (DFT) has emerged. One DFT technique involves designing into the chip one or more "scan chains" that may be used to write and read portions of the chip that would otherwise be inaccessible. Layout tools are used to lay out a chip design onto silicon. The resulting chip layout may be represented in the form of a netlist, i.e., a list of low-level design cells and the interconnections between them. The chip layout may also be represented in the form of a physical design file representing multiple layers of polygons. Once the design is completed, the part is "taped out" (i.e., files representing the chip are written to tape or disk). One format used for such files is the GDSII format. A mask house then makes photomasks used to manufacture the chip.

Both memory chips and logic chips require production monitoring and testing. Production monitoring is performed using "in-line" inspection equipment, and production testing is performed using "end-of-line" test equipment. In-line inspection equipment inspects entire semiconductor wafers, each of which may have formed thereon hundreds of chips. End-of-line test equipment performs "binsort functional test" on semiconductor wafers in which the pads of chips are contacted and the chips "exercised." At the conclusion of functional test, parts are "binned" (typically, placed in different categories within an electronic record) according to the test results.

Apart from production testing is failure analysis. Failure analysis attempts to identify the cause of failures of chips of a particular chip design after those failures have been detected during production (or prototype) testing. Failure analysis may typically require more detailed failure information than just a bin code. Detailed failure information is typically obtained by retesting a limited number of packaged parts.

Memory chips, because of their structure as regular arrays of memory cells, readily lend themselves to failure analysis. A memory chip may be tested by performing a series of read and write operations to the memory chip. Errors in read/write testing may be pin-pointed as likely physical defects at readily-identifiable locations on the chip. Alternatively, the memory chip design may contain built-in self-test (BIST) capabilities. In either case, functional test results can be "bitmapped" to failure locations on the memory chip. In memory bitmapping, electrical failures are localized within a relatively small physical "trace" on the die.

Process flow in accordance with conventional memory bitmap testing is illustrated in FIG. 1. A wafer is subjected to both in-line inspection (right-hand column) and end-of-line testing (left-hand column). In-line inspection may be performed, for example, using optical inspection equipment such as the KLA21xx series available from KLA Tencor. In-line inspections produce defect files containing X,Y location optical defect information. This information may then be output in any convenient format, an example of which is a format used by the Yield Manager tool of, Knights Technology. End-of-line testing is performed using a tester, sometimes referred to as ATE (Automatic Test Equipment). The tester identifies failed memory locations. This information is processed to identify X,Y defect locations. The X,Y defect information may also be output to the Yield Manager tool. Because in-line and end-of-line defect information is in the same format within the Yield Manager tool, a combined defect overlay may be obtained, enabling "killer defects" (defects that render a part non-functional) to be identified. In particular, if the locations of a defect and a failure coincide, the defect may be presumed to a be a killer defect, i.e., a direct cause of the failure, in which case trouble-shooting would then focus on the production process rather than the underlying design of the part.

As a result of the greater testability of memory chips, yield enhancement organizations within semiconductor manufacturing plants, or fabs, have long relied on memory chips to de-bug a given generation of technology. Yield enhancement engineers have typically used a memory production line to monitor the production process and ensure yield on other production lines of logic products using the same technology. For yield enhancement of memory chips, in-line defect inspection tools have been used, together with end-of-line functional test bitmap results. Memory bitmap failure data may be further summarized into failure categories (e.g., single-bit failure, column failure, row failure, etc.).

Given coordinates of memory failures, failure analysis engineers can use a variety of "physical deprocessing" methods to identify the root cause of the failure. Based on the failure category, engineers can estimate where in the production process the failure occurred (e.g., the polysilicon layer deposition step, the metal 1 layer deposition step, etc.).

However, in recent years, the market share of logic products within the semiconductor industry has greatly increased, resulting in many new "logic-only" fabs being brought on-line. Unfortunately, without the benefit of a "memory line monitor," logic-only fabs cannot take full advantage of yield enhancement techniques developed within the industry over many years. The logic-only yield enhancement engineer today is severely handicapped when compared to counterparts in fabs that run memory products. Heretofore, there has been no way to "bitmap" area of logic within a chip. Furthermore, logic chip functional test results do not provide a starting point for the physical coordinates of failures within a failed die.

The most advanced logic chip designs contain scan testing. Scan testing breaks the logic real estate of a chip into many discrete chains of logic which can be tested individually for basic functionality. Scan testing enables a list of failing signals to be identified. However, even after a list of failing signals is produced for a given die, it is still not possible to find the physical location of the failure because each failing signal may contain hundreds of transistors within its "cone of logic," and there are usually multiple failing signals. Traditional logic chip yield enhancement techniques therefore rely heavily on correlation of binsort functional test results to anticipate and correct semiconductor process issues. This approach suffers from several drawbacks, including: the inability to relate a particular bin's fallout to a suspect process level; the inability to distinguish pre-packaging yield issue from packaging yield issues; and the inability to establish a clear link between large populations of failed die.

Failure analysis may make use of a known electrical diagnosis process whereby a diagnostic list of suspected failing nets may be obtained as shown in FIG. 2. Packaged devices having BIST (scan) capabilities are tested using a tester. Scan failure data is translated into format that can be used by an ATPG (Automatic Test Pattern Generation) tool, e.g., an ATPG tool used previously to generate test pattern files used by the tester. The ATPG tools uses the translated test data, together with the test pattern files, setup files, one or more ATPG diagnostic models, and design information from a design database in order to identify suspected failing nodes, output in the form of a diagnostic list (FIG. 3).

CAD navigation tools have been developed to aid in failure analysis. CAD navigation refers to the ability to point and click within a circuit layout display and by so doing automatically drive a piece of equipment such as FIB (Focused Ion Beam) equipment to that location on the chip. CAD navigation also allows a user to specify the name of a net, causing the corresponding layout to be displayed. One such CAD navigation tool is the Merlin Framework CAD navigation tool of Knights Technology. This tool takes netlist information, layout information, and cross-reference files relating the two and produces a unified database in a Knights-proprietary format having an efficient indexing structure. Referring more particularly to FIG. 4, the process of creating such a Knights database is illustrated in greater detail. A SPICE-formatted netlist is converted (if required) to a suitable netlist format. Data from a Schematic Verification database is converted (if required) to obtain cross-reference files cross-referencing net names and numerical net identifiers. Layout data is converted (if required) to a suitable polygon layout format. An MMapper routine uses the netlist, cross-reference files and polygon layout files in the following manner to produce a database suitable for CAD navigation.

SUMMARY OF THE INVENTION

The present invention, generally speaking, takes advantage of the foregoing capability to determine and display the X,Y location corresponding to a net name, by translating functional test data of a digital logic chip passed through a simulation model which identifies one or more defective nets of the chip. The defective nets are processed against a database of the foregoing type to obtain X,Y coordinate data for these nets, allowing them to be data logged as physical traces on the chip layout. In accordance with an exemplary embodiment, this mapping is performed by taking the output from a functional tester and translating it from a list of failed scan chains into a list of suspected netlist nodes. The X,Y coordinates of suspected netlist nodes are then identified and stored in a database, providing failure analysis and yield enhancement engineers a starting point for performing failure analysis and for immediately understanding whether "in-line" inspection data can account for a given failure. These nodes may then be crossmapped from the circuit design onto the chip's layout for each of multiple photomask layers within the design. Detailed failure data is gathered and stored at the wafer stage as part of a comprehensive program rather than on an as-needed basis at the packaged part stage. A voluminous amount of high-quality data is therefore obtained in an entirely automated fashion, as opposed to obtaining a comparatively minuscule amount of lesser-quality data in an exceedingly laborious fashion.

BRIEF DESCRIPTION OF THE DRAWING

The present invention may be further understood from the following description in conjunction with the appended drawing. In the drawing:

FIG. 1 is a block diagram of a known memory bitmap process flow;

FIG. 2 is a block diagram of a known electrical diagnosis process flow;

FIG. 3 is an example net/node list obtained from a circuit analysis tool;

FIG. 4 is a more detailed flow diagram illustrating the manner in which a known database suitable for CAD navigation is produced;

FIG. 5 is a block diagram of a Logic Map process flow in accordance with the present invention;

FIG. 6 is a generalized representation of Logic Map process flow;

FIG. 7 is a magnified view of an overlay of defect data and logic-mapped failure data;

FIG. 8 is an example of a killer ratio chart;

FIG. 9 is an example of a defect intensity stackmap;

FIG. 10 is an alternative representation of Logic Map process flow;

FIG. 11 is a diagram of a Logic Map system in accordance with one embodiment of the invention; and FIG. 12 is a more detailed flow diagram helpful in understanding an example of one specific implementation of the Logic Map process.

DETAILED DESCRIPTION OF THE PREFERRED EMBODIMENTS

Referring now to FIG. 5, process flow in accordance with a Logic Map process is shown. The wafer is assumed to have scan test capabilities. In-line inspection is performed as described previously in relation to FIG. 1. End-of-line testing, because the wafer is a logic product and not a memory product, is substantially different. As described in greater detail hereinafter, end-of-line testing produces an "ATE datalog". Using the ATE datalog and other information, a diagnosis step then follows using an ATPG tool. The diagnosis step produces a diagnostic list of suspected failing nets. This information is processed together with design information to identify X,Y defect locations. The X,Y defect information may also be output in any desired format, e.g., the Yield Manager format. Because in-line and end-of-line defect information is in the same format, a combined defect overlay may be obtained, allowing killer defects to be readily identified.

The logical-to-physical translation of failure data is accomplished by a process referred to herein as Logic Map. Logic Map allows the X,Y coordinates of failing netlist nodes to be generated. A generalized representation of the flow of data in the Logic Map system is shown in FIG. 6. Logic Map begins with wafer-level functional testing, which produces a functional test output file (e.g., an ASCII file). Once a functional test output file has been obtained, known methods may be used to post-process the functional test results and convert them into a list of failed signals suitable for input into a design diagnostic model. Various commercial circuit analysis tools provide for design diagnostic modeling. One such tool is the FastScan circuit analysis tool of Mentor Graphics.

The converted functional test output file is input to a circuit analysis tool. The function of the circuit analysis tool is to produce a list of suspected failing nets. An example of such a list is shown in FIG. 3.

The precision with which the suspected netlist vectors identify failure locations depend on the adequacy of the design diagnostic model, or simulation model. The circuit designer's input is needed to establish an accurate and efficient model of a design.

In the design role, simulation models are intended to use as much computing time as necessary to find the minimum number of suspected failed netlist nodes. For example, for a circuit designer to run a simulation model of one failed die make take several minutes to one hour to produce one or two suspected failure vectors. This manner of operation is consistent with the role the circuit analysis tool usually plays in circuit design and verification. To adapt the simulation model to translate functional test data within a production wafer fab, the output datastream of suspected netlist nodes is caused to be much higher than in the circuit design and verification role. In order to provide real-time failure information via logic mapping, the simulation model running in a production fab should be able to diagnose a failed die within one minute, even if that means that the list of suspected failing nodes will be larger (e.g., 3 to 10 nodes).

Furthermore, to allow for production use, the simulation model is adapted to run in batch mode, or background mode. Hands-off, continuous processing of test data and enterprise-wide, real-time distribution of results is thereby achieved.

When operating in batch mode, the output of the simulation model is continuously directed to a translator for conversion to a standard defect file format. A suitable translator is provided by the Merlin CAD navigation framework software of Knights Technology. The framework software converts the output datastream of suspected failing nodes to a physical bitmap file using layout data for the wafer. The framework software also allows the physical bitmap may be overlaid onto the device layout as a layout trace, as shown in FIG. 7. The layout trace may be displayed in as many dimensions as there are photomasks. Preferably, each photomask level's trace of the suspect failing netlist nodes is output into a separate file so that precise correlations with in-line defect data can be made (i.e., metal defects can be compared to a suspected node's fail trace at the metal photomask).

The physical bitmap file may be exported to various yield management tools such as the Yield Manager tool of Knights Technology. Yield management tools provide various visualization options, e.g., defect wafermaps, bitmaps, and charts. Kill ratio charts, an example of which is shown in FIG. 8, are available to evaluate the degree of defect matches to logic bitmap failures. Bitmap failure intensity stackmaps, an example of which is shown in FIG. 9, can suggest areas of the layout susceptible to failure If desired, bitmap data may be output into any of various standard output formats for detect data, e.g., KLA format, ESDA format, etc. In this manner, logic mapping data and in-line test data may be collected in a common format for further processing.

An alternative representation of the Logic Map process is shown in FIG. 10. Datalogs for each die tested are sent to a server (e.g., a Unix server running an ATPG software package such as Fastscan, Sunrise, etc.). If a chip experiences a fundamental failure, then the datalog obtained for that chip is not usable. Typically, however, a large fraction of the datalogs are usable. The server translates these datalogs into an appropriate simulation format. Logic Map uses the translated datalogs and design data to generate the X,Y coordinates of failing netlist nodes. As described more fully hereinafter, the design data used by the logic mapper may include, for example, input from GDSII layout files, netlist data, and LVS (Layout Versus Schematic) data. After X,Y coordinate data has been obtained, the X,Y coordinate data may then be used for both failure analysis and yield analysis. Whereas failure analysis is usually a rather prolonged process, yield analysis has real-time data requirements. The Logic Map process satisfies these real-time data requirements as described hereinafter.

Referring to FIG. 11, a diagram is shown of a Logic Map system in accordance with one embodiment of the invention. As previously described in relation to FIG. 10, datalogs for each die tested are sent to a server (e.g., a Unix server running an ATPG software package such as Fastscan, Sunrise, etc.) where a fraction of the datalogs are translated into an appropriate simulation format. Logic Map uses the translated datalogs and design data to generate the X,Y coordinates of failing netlist nodes. This information may be stored in a database of a yield management tool such as the Yield Manager tool of Knights Technology.

The Logic Map translator converts incoming diagnostic lists into a standard defect data format. The resulting diagnostic data is combined with in-line inspection data within the Yield Manager database. In an exemplary embodiment, the Yield Manager database is used to overlay in-line defect data and Logic Map data. Once the in-line defect data and the Logic Map data reside in a common format on a common database, client software such as the Yield Manager client, running on high-end (e.g., Windows NT) PCs, may be used to enable visualization of the data in various ways, e.g., wafermaps, charts, layout, etc. In addition, data may be exported in various file formats to facilitate data sharing.

As previously described, many overlay and visual aids are available once the failing netlist trace is translated to a standard defect file format. Defect matching may be performed based on a user-defined proximity radius from defects (inline) to any point on a Logic Mapper trace. Yield management tools can be used to pre-filter defect data to eliminate "nuisance" defects prior to matching. Defects with product-correlated hits can be exported back to the CAD navigation framework, e.g., for FIB (Focussed Ion Beam) navigation and de-processing. The defects which are hits can be selectively analyzed as a group to determine what defect types are most likely to be fatal and to determine other important distinctions such as defect size or intensity distribution. There results a new paradigm of how to use test data.

EXAMPLE

Logic Map was implemented on a Texas Instruments production line. Details of the particular implementation are shown in FIG. 12. The layout of Figure 12 is such that operations performed are represented in the center column and data (or program) inputs are represented in the left-hand and right-hand flanking columns. The upper portion of the figure relates to electrical diagnostic flow. Note that, as compared to conventional electrical diagnostic flow (FIG. 2), in FIG. 12, wafers are tested rather than packaged devices. A test program is modified in order to obtain detailed failure data rather than simple "go/no-go" data as in a conventional production line. A die decode table and a decode translator are developed for each device type to ensure that test data associated with a particular die on a wafer is mapped to the correct die coordinates within the Yield Manager database.

The lower portion of the figure relates to the Logic Map process flow. Diagnostic data is translated into a format readable by a polygon file generator. The polygon file generator reads the translated diagnostic data and processes it against the database previously obtained (FIG. 4) in order to generate polygon files. These polygon files may in turn be translated to obtain standard defect files of a desired format.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of automated defect localization in the testing of semiconductor integrated circuits, comprising the steps of:

testing the logic integrated circuits to obtain generalized failure data;

inputting the generalized failure data and circuit models describing logical operations of the integrated circuits to a circuit analysis tool;

obtaining from the circuit analysis tool first localized probable defect data;

performing in-line inspection of the integrated circuits to obtain second localized probable defect data; and correlating the first and second localized probable defect data.

2. The method of claim 1, wherein the steps of inputting the generalized failure data to a circuit analysis tool and obtaining from the circuit analysis tool first localized probable defect data are performed continuously using at least one programmed computer.

3. The method of claim 1, wherein correlating the first and second localized probable defect data comprises producing a visual overlay of the first and second localized probable defect data.

4. The method of claim 1, wherein the integrated circuits are logic circuits having built-in self-test capabilities.

5. The method of claim 1, wherein the generalized failure data is obtained using end-of-line testing of the integrated circuits.

6. The method of claim 5, wherein the integrated circuits are tested in wafer form.

7. The method of claim 1, wherein obtaining from the circuit analysis tool first localized probable defect data comprises:

creating a database against which the logic defect data is processed to obtain physical defect data; and processing the logical defect data against the database to obtain physical defect data.

8. The method of claim 7, wherein creating the database comprises translating design information from a first format to a second format.

9. A system for testing logic semiconductor integrated circuits, comprising:

a circuit analysis tool; and means for automatically:

applying to the circuit analysis tool generalized failure data;

obtaining from the circuit analysis tool localized probable defect data and circuit models describing logical operations of the integrated circuits;

representing the localized probable defect data in a standard format; and storing the localized probable defect data on a database server accessible to multiple client machines.

* * * * *